US010147633B2

(12) United States Patent
Himori et al.

(10) Patent No.: US 10,147,633 B2
(45) Date of Patent: Dec. 4, 2018

(54) TRANSFER APPARATUS AND PLASMA PROCESSING SYSTEM (75) Inventors: Shinji Himori, Kurokawa-gun (JP); Takehiro Kato, Kurokawa-gun (JP); Etsuji Ito, Kurokawa-gun (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1172 days.

(21) Appl. No.: 13/611,327

(22) Filed: Sep. 12, 2012

(65) Prior Publication Data
US 2013/0062016 A1    Mar. 14, 2013

Related U.S. Application Data (60) Provisional application No. 61/537,785, filed on Sep. 22, 2011.

(30) Foreign Application Priority Data

Sep. 12, 2011   (JP) ................................. 2011-198599

(51) Int. Cl.
| B65G 43/00 | (2006.01) |
| B65G 47/90 | (2006.01) |
| H01L 21/677 | (2006.01) |
| H01L 21/687 | (2006.01) |

(52) U.S. Cl.
CPC ........ *H01L 21/68707* (2013.01); *B65G 43/00* (2013.01); *B65G 47/90* (2013.01); *H01L 21/67709* (2013.01)

(58) Field of Classification Search
USPC ............ 156/345.23, 345.32, 345.31, 345.51; 118/719, 729
See application file for complete search history.

(56) References Cited

U.S. PATENT DOCUMENTS

| 4,542,712 A | * | 9/1985 | Sato ........................ C30B 23/02 118/500 |
| 4,998,859 A | * | 3/1991 | Oshima ............. H01L 21/67748 29/740 |
| 5,147,828 A | * | 9/1992 | Ebbing ............. H01L 21/68721 269/8 |
| 5,234,303 A | * | 8/1993 | Koyano ............ H01L 21/67742 414/217 |

(Continued)

FOREIGN PATENT DOCUMENTS

JP          2007208235         8/2007

*Primary Examiner* — Gordon Baldwin
*Assistant Examiner* — Mirza Israr Javed
(74) *Attorney, Agent, or Firm* — Cantor Colburn LLP (57) ABSTRACT A transfer apparatus transfers an object to be transferred onto a case. The transfer apparatus includes a transfer arm, an arm shaft, a plurality of electromagnets, and a control unit. The transfer arm has a pick unit on a front end thereof and extends and retracts in a horizontal direction. The object to be transferred is held on the pick unit. The arm shaft supports the transfer arm. The plurality of electromagnets apply an force in upward direction to the transfer arm by generating a magnetic field in the case. The control unit controls the plurality of electromagnets in such a manner that when the transfer arm extends and retracts in the horizontal direction, the force in upward direction applied to the transfer arm increases as a length from the arm shaft to the front end of the transfer arm increases.

9 Claims, 12 Drawing Sheets (56) References Cited

U.S. PATENT DOCUMENTS

| | | | | |
|---|---|---|---|---|
| 5,288,199 A | * | 2/1994 | Enomoto | H01L 21/67742 414/744.6 |
| 5,614,055 A | * | 3/1997 | Fairbairn | H01J 37/321 118/723 AN |
| 5,641,054 A | * | 6/1997 | Mori | H01L 21/67167 104/284 |
| 6,634,845 B1 | * | 10/2003 | Komino | B65G 49/06 414/217 |
| 7,472,786 B2 | * | 1/2009 | Komori | B60L 13/04 104/284 |
| 7,868,488 B2 | * | 1/2011 | Lee | F16C 39/063 310/12.01 |

* cited by examiner

| ARM POSI-TION | MAGNETIC FIELD CONTROL REGION (YES: WITH MAGNETIC FIELD, -: NO MAGNETIC FIELD) | | | | | |
|---|---|---|---|---|---|---|
| | G1 | G2 | G3 | G4 | G5 | G6 |
| A | – | – | – | – | – | – |
| ⋮ | YES | – | – | – | – | – |
| ⋮ | YES | YES | – | – | – | – |
| ⋮ | YES | YES | YES | – | – | – |
| B | YES | YES | YES | YES | – | – |

| ARM POSI-TION | MAGNETIC FIELD CONTROL REGION (YES: WITH MAGNETIC FIELD, -: NO MAGNETIC FIELD) | | | | | |
|---|---|---|---|---|---|---|
| | G1 | G2 | G3 | G4 | G5 | G6 |
| A | — | — | — | — | — | — |
| ⋮ | YES (MAGNETIC FIELD 1) | — | — | — | — | — |
| ⋮ | — | YES (MAGNETIC FIELD 2) | — | — | — | — |
| ⋮ | — | — | YES (MAGNETIC FIELD 3) | — | — | — |
| B | — | — | — | YES (MAGNETIC FIELD 4) | — | — |

TRANSFER APPARATUS AND PLASMA PROCESSING SYSTEM

CROSS-REFERENCE TO RELATED PATENT APPLICATIONS

This application claims the benefit of Japanese Patent Application No. 2011-198599, filed on Sep. 12, 2011, in the Japan Patent Office and U.S. Patent Application Ser. No. 61/537,785, filed on Sep. 22, 2011, in the United States Patent and Trademark Office, the disclosure of which are incorporated herein in their entireties by reference.

BACKGROUND OF THE INVENTION

1. Field of the Invention

Various aspects and embodiments of the present invention relate to a transfer apparatus and a plasma processing system.

2. Description of the Related Art

Patent Document 1 discloses a type of transfer apparatus for transferring a substrate. The transfer apparatus disclosed in the Patent Document 1 includes a transfer arm that extends and retracts in a horizontal direction. A slide pick that functions as a support for supporting the substrate is provided on the transfer arm. The slide pick is obliquely attached to the transfer arm such that a front end portion is positioned higher than a base end portion. Accordingly, even when the transfer arm is warped due to its weight, since the downward warp may be offset by an inclination of the slide pick, the substrate may be kept in a substantially horizontal position.

(Patent Document 1) Japanese Laid-Open Patent Publication No. 2007-208235

SUMMARY OF THE INVENTION

As a substrate gets larger, there is a demand for a structure that may further suppress a warp of a transfer arm. In the present art, there is a demand for a transfer apparatus and a plasma processing system that may reduce a downward inclination of a front end of a transfer arm due to a warp.

According to an aspect of the present invention, there is provided a transfer apparatus for transferring an object to be transferred into a case. The transfer apparatus includes a transfer arm, an arm shaft, a plurality of electromagnets, and a magnetic field control unit. The transfer arm has a pick unit a front end thereof and extends and retracts in a horizontal direction. The object to be transferred is held on the pick unit. The arm shaft supports the transfer arm. The plurality of electromagnets apply a force in upward direction to the transfer arm by generating a magnetic field in the case. The magnetic field control unit controls the plurality of electromagnets in such a manner that when the transfer arm extends or retracts in the horizontal direction, the force in upward direction applied to the transfer arm increases as a length from the arm shaft to the front end of the transfer arm increases.

In the transfer apparatus, the plurality of electromagnets are controlled by the magnetic field control unit such that the force in upward direction applied to the transfer arm increases as the length from the arm shaft to the front end of the transfer arm increases. That is, the magnetic field in the case is controlled according to the length from the arm shaft to the front end of the transfer arm, and the force in upward direction is applied to the transfer arm. Due to the force in upward direction applied by the magnetic field, even when the transfer arm extends, a downward inclination of the front end of the transfer arm may be reduced.

At least a portion of the transfer arm may be formed of a magnetic body. The plurality of electromagnets may be disposed over the transfer arm and apply the force in upward direction to the transfer arm due to an attractive force with the magnetic body. Accordingly, the force in upward direction may be applied by the attractive force generated between the transfer arm and the plurality of electromagnets.

A magnetized magnetic body may be attached to at least a portion of the transfer arm. The plurality of electromagnets may be disposed under the transfer arm and apply the force in upward direction to the transfer arm due to a repulsive force with the magnetic body. Accordingly, the force in upward direction may be applied to the transfer arm due to the repulsive force generated between the transfer arm and the plurality of electromagnets.

The plurality of electromagnets may be arranged in a lattice shape to face the transfer arm. Accordingly, the magnetic field may be precisely controlled.

According to a position of the pick unit, the magnetic field control unit may increase the number of electromagnets to which current is supplied. Accordingly, since the magnetic field in the case increases as the length from the arm shaft to the front end of the transfer arm increases, the plurality of electromagnets may be controlled to increase the force in upward direction applied to the transfer arm.

According to a position of the pick unit, the magnetic field control unit may increase the amount of current supplied to the plurality of electromagnets. Accordingly, since the magnetic field in the case increases as the length from the arm shaft to the front end of the transfer arm increases, the plurality of electromagnets may be controlled to increase the force in upward direction applied to the transfer arm.

The magnetic field control unit may control the plurality of electromagnets disposed to face the position of the pick unit. Accordingly, current may be supplied to only the electromagnets close to the front end of the transfer arm, and the amount of current may be increased according to a position of the pick unit. Accordingly, the plurality of electromagnets may be efficiently controlled to increase the force in upward direction applied to the transfer arm.

According to another aspect of the present invention, there is provided a plasma processing system including a plasma processing device and a transfer apparatus. The plasma processing device performs plasma processing on a substrate. The transfer apparatus transfers the substrate to the plasma processing device. The plasma processing device includes a processing container, a lower electrode, an upper electrode, a radio frequency power supply unit, a processing gas supply unit, and a plurality of electromagnets. The processing container defines a processing space. The lower electrode has a top surface for holding the substrate and is disposed in a lower portion of the processing space. The upper electrode is disposed in an upper portion of the processing space to face the lower electrode. The radio frequency power supply unit supplies a radio frequency voltage to at least one of the lower electrode and the upper electrode. The processing gas supply unit supplies a processing gas into the processing space. The plurality of electromagnets generate a magnetic field in the processing container. The transfer apparatus includes a transfer arm and an arm shaft. The transfer arm has a pick unit on the front end thereof and extends or retracts in a horizontal direction.

The substrate is held on the pick unit. The arm shaft supports the transfer arm. The plasma processing system further includes a magnetic field control unit. The magnetic field control unit controls the plurality of electromagnets. When the substrate is transferred to the plasma processing device, the magnetic field control unit controls the plurality of electromagnets in such a manner that an force in upward direction applied to the transfer arm increases as a length from the arm shaft to the front end of the transfer arm increases, and when plasma processing is performed on the substrate by using the radio frequency power supply unit and the processing gas supply unit, controls the plurality of electromagnets in such a manner that a magnetic field is generated in the processing container.

In the plasma processing system, the plurality of electromagnets are controlled by the magnetic field control unit such that the force in upward direction applied to the transfer arm increases as the length from the arm shaft to the front end of the transfer arm increases. That is, the magnetic field in the case is controlled according to the length from the arm shaft to the front end of the transfer arm, and the force in upward direction is applied to the transfer arm. Due to the force in upward direction applied by the magnetic field, even when the transfer arm extends, a downward inclination of the front end of the transfer arm may be reduced. Also, when plasma processing is performed on the substrate, the plurality of electromagnets are controlled to generate the magnetic field in the processing container. Due to the magnetic field, plasma may be stably maintained. As such, the magnetic field for stably maintaining plasma and the magnetic field for applying the force in upward direction to the transfer arm may be generated by using the same electromagnets.

At least a portion of the transfer arm may be formed of a magnetic body. The plurality of electromagnets may be disposed on the upper electrode and apply the force in upward direction to the transfer arm due to an attractive force with the magnetic body. Accordingly, the force in upward direction may be applied to the transfer arm due to the attractive force generated between the transfer arm and the plurality of electromagnets.

BRIEF DESCRIPTION OF THE DRAWINGS

The above and other features and advantages of the present invention will become more apparent by describing in detail exemplary embodiments thereof with reference to the attached drawings in which:

FIGS. 3A and 3B are top views showing a transfer arm of FIG. 1, wherein FIG. 3A shows that the transfer arm retracts and FIG. 3B shows that the transfer arm extends;

FIGS. 8A and 8B are views for explaining an operation and effect of a transfer apparatus according to an embodiment of the present invention, wherein FIG. 8A shows an attractive force is generated and FIG. 8B shows that a repulsive force is generated; and FIGS. 9A and 9B are schematic views for explaining a conventional transfer apparatus, wherein FIG. 9A shows a transfer arm retracts and FIG. 9B shows that the transfer arm extends.

DETAILED DESCRIPTION OF THE INVENTION

The present invention will now be described more fully with reference to the accompanying drawings, in which exemplary embodiments of the invention are shown. Also, in the drawings, the same or corresponding elements are denoted by the same reference numerals.

Figure 1:
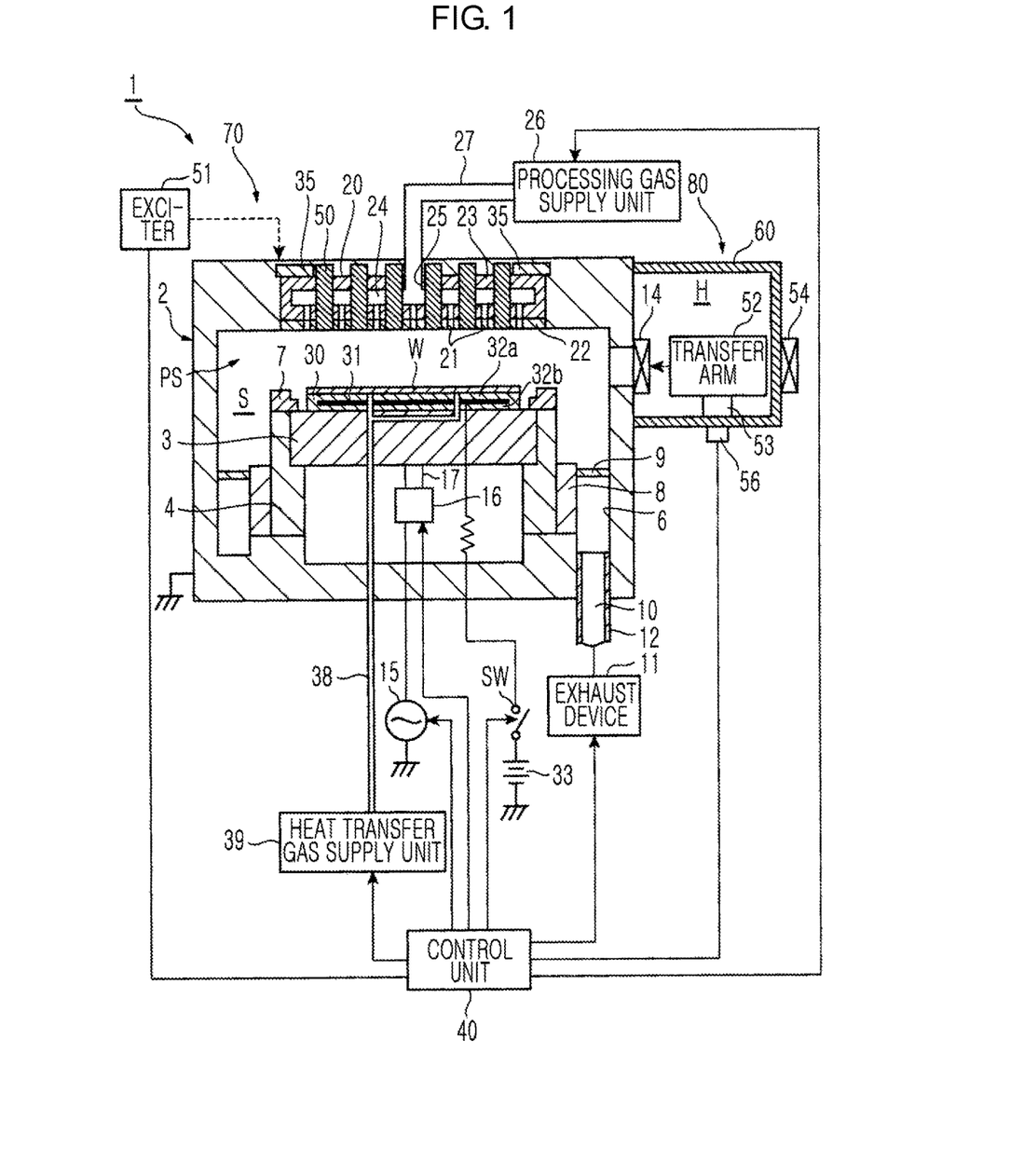
FIG. 1 is a view schematically showing a plasma processing system according to an embodiment of the present invention.

FIG. 1 is a view schematically showing a plasma processing system 1 according to an embodiment of the present invention. As shown in FIG. 1, the plasma processing system 1 includes a parallel-plate plasma processing device 70 having a parallel flat shape, and a transfer apparatus 80. The plasma processing device 70 includes a chamber (processing container; 2). The chamber 2 has a substantially cylindrical shape, and an inner space of the chamber is defined as a processing space S.

A holding stage 3 is provided as a lower electrode or a susceptor in a lower portion of the processing space S of the chamber 2. The holding stage 3 has a top surface on which a substrate to be processed, for example, a semiconductor wafer (object to be transferred) W, is held. An electrostatic chuck 30 for holding the semiconductor wafer W by using an electrostatic adhesive force is provided on the top surface of the holding stage 3. The electrostatic chuck 30 is formed by inserting an electrode 31 formed of a conductive film between one pair of insulating films 32a and 32b, and a direct current (DC) power supply 33 is electrically connected through a switch SW to the electrode 31. Due to a DC voltage output from the DC power supply 33, the semiconductor wafer W is adsorbed and fixed on the electrostatic chuck 30 by using a Coulomb force.

The holding stage 3 is supported by a support unit 6 that has a cylindrical shape and extends vertically from a bottom of the chamber 2 and a holding unit 4 having an insulating cylindrical shape is interposed between them. The holding stage 3 may be formed of, for example, aluminum. A focus ring 7 is disposed on a top surface of the holding unit 4 having the cylindrical shape so as to annularly surround the top surface of the holding stage 3. The focus ring 7 may be a plate-shaped member having a substantially annular shape, and may be formed of, for example, silicon, quartz, or silicon carbide.

A radio frequency power supply (radio frequency power supply unit) 15 for generating plasma is electrically connected through a matcher 16 and a power supply rod 17 to the holding stage 3. The radio frequency power supply 15 supplies radio frequency power at a predetermined frequency (for example, a frequency equal to or greater than 13 MHz) to the lower electrode, that is, the holding stage 3. Also, a heat transfer gas supply unit 39 is connected through a gas supply line 38 to the holding stage 3. The heat transfer gas supply unit 39 supplies a heat transfer gas (for example, a He gas) between a top surface of the electrostatic chuck 30 and a bottom surface of the semiconductor wafer W.

A shower head 20 is provided as an upper electrode at a ground potential in an upper portion of the chamber 2 to face the holding stage 3 in parallel. A radio frequency electric field is formed in a space between the holding stage 3 and the shower head 20, that is, a plasma generating space PS, due to the radio frequency output from the radio frequency power supply 15.

The shower head 20 includes an electrode plate 22 that has a plurality of gas vent holes 21 and an electrode holder 23 that detachably holds the electrode plate 22. A buffer chamber 24 is formed inside the electrode holder 23, and a gas supply pipe 27 connects to a gas inlet 25 of the buffer chamber 24 with a processing gas supply unit.

Figure 2:
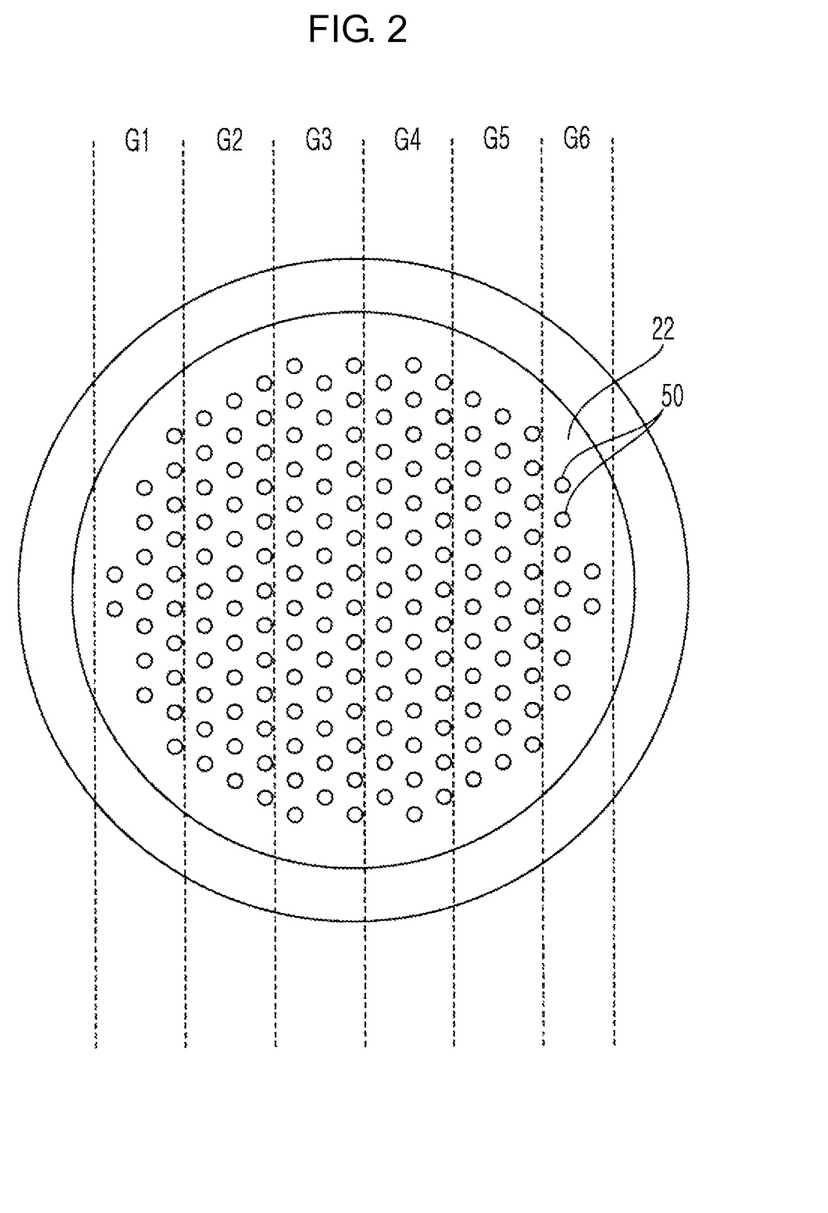
FIG. 2 is a bottom view showing an upper electrode of FIG. 1.

FIG. 2 is a bottom view for showing the shower head 20. As shown in FIGS. 1 and 2, a plurality of electromagnets 50 for generating a magnetic field are arranged on the shower head 20. The electromagnets 50 are arranged in, for example, a lattice shape. Also, the electromagnets 50 are disposed between the gas vent holes 21. Since the electromagnets 50 each include a coil and an iron core and are connected to an exciter 51, the electromagnets 50 form a magnetic field having a strength proportional to the amount of current supplied to the electromagnets 50. The plurality of electromagnets 50 are divided into groups G1 through G6, and current may be supplied to the electromagnets 50 in units of groups.

A first heater 35 is disposed over the shower head 20. The first heater 35 is a heat source for applying heat to the shower head 20 and controlling a temperature of the electrode plate 22, and has an annular shape. An outer diameter of the first heater 35 is greater than an outer diameter of the shower head 20.

An exhaust path 8 is formed between the support unit 6 having the cylindrical shape and a side wall of the chamber 2. A baffle plate 9 is attached to an inlet of the exhaust path 8 or a middle portion of the exhaust path 8, and a exhaust port 10 is formed in a lower portion of the exhaust path 8. An exhaust device 11 is connected to the exhaust port 10 through an exhaust pipe 12. The exhaust device 11 includes a vacuum pump and a control valve, and may reduce a pressure of the processing space S in the chamber 2 to a predetermined vacuum level. A gate valve 14 for opening/closing a semiconductor wafer inlet/outlet is attached to a side wall of the chamber 2.

The transfer apparatus 80 includes a transfer chamber 60. The transfer chamber 60 is connected to the chamber 2 through the gate valve 14. The transfer chamber 60 has a substantially cylindrical shape, and an inside of the transfer chamber 60 is defined as a processing space H. A gate valve 54 for opening/closing a semiconductor wafer inlet/outlet is attached to a side wall of the transfer chamber 60. A transfer arm 52 is disposed in the processing space H.

Figure 3A:
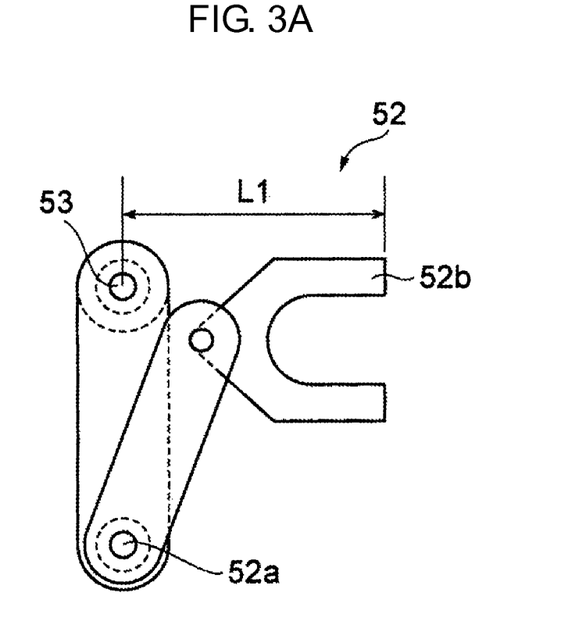
Figure 3B:
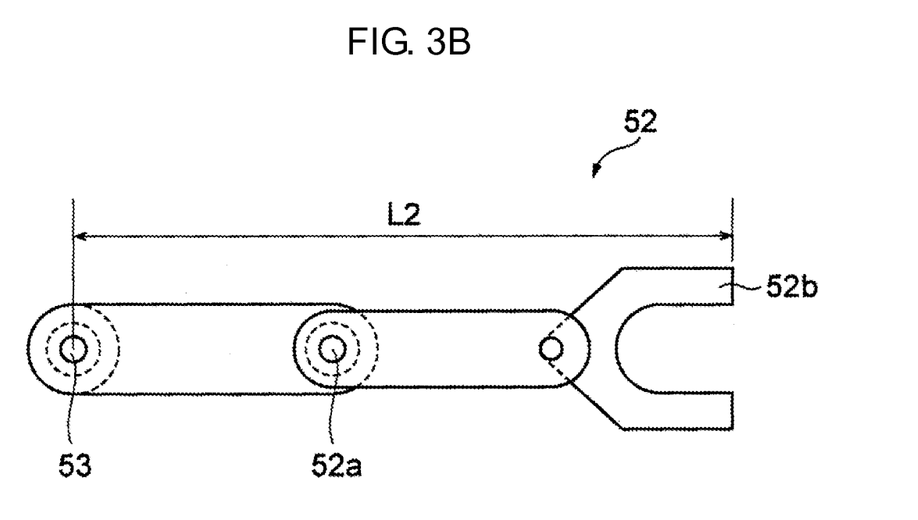

The transfer arm 52 is supported on a bottom of the transfer chamber 60 by an arm shaft 53. For example, a multi-joint arm or a slide arm is used as the transfer arm 52. The arm shaft 53 is connected to a drive unit 56, and rotatably supports the transfer arm 52. For example, a stepping motor is used as the drive unit 56. FIGS. 3A and 3B are top views for showing the transfer arm 52 of FIG. 1. The transfer arm 52 is a multi-joint arm including a bending portion 52a, and has a pick unit 52b which is formed on the front end thereof and on which the semiconductor wafer W is held. The transfer arm 52 extends and retracts in a diameter direction (horizontal direction) about the arm shaft 53. FIG. 3A shows a status where the transfer arm 52 retracts. In this case, a distance from the arm shaft 53 to the front end of the pick unit 52b (front end of the transfer arm 52) is L1. FIG. 3B shows a status where the transfer arm 52 extends. In this case, a distance from the arm shaft 53 to the front end of the pick unit 52b (front end of the transfer arm 52) is L2, which is greater than the distance L1.

At least a portion of the transfer arm 52 may be formed of a magnetic body. Accordingly, a strong attractive force is applied between the electromagnets 50 and the transfer arm 52. The magnetic body may be magnetized. When a magnetized magnetic body is used, in order to apply an attractive force between the electromagnets 50 and the transfer arm 52, the magnetic body may be set to have an N pole and an S pole or a current supply direction in which power is supplied to the electromagnets 50 may be set. Alternatively, the magnetized magnetic body (permanent magnet) may be attached to at least a portion of the transfer arm 52. Even in this case, in order to apply an attractive force between the electromagnets 50 and the transfer arm 52, an N pole and an S pole may be set or a power supply direction in which power is supplied to the electromagnets 50 may be set. Also, the semiconductor wafer W is transferred to the holding stage 3 facing the shower head 20 by the transfer arm 52 including the pick unit 52b. Accordingly, the plurality of electromagnets 50 disposed on the shower head 20 are arranged in a lattice shape to face the transfer arm 52.

A control unit 40 individually controls each element in the plasma processing device 70, and controls an overall sequence. For example, the control unit 40 is configured to control the exhaust device 11, the radio frequency power supply 15, the switch SW, the heat transfer gas supply unit 39, the processing gas supply unit 26, the exciter 51, and the drive unit 56. The control unit 40 controls a vacuum level or a gas amount in the chamber 2 by controlling the exhaust device 11 (or a valve connected to the exhaust device 11) and the processing gas supply unit 26. Also, the control unit 40 controls an application time and a magnitude of a radio frequency voltage supplied by the radio frequency power supply 15 to the holding stage 3. That is, the control unit 40 may control elements to generate plasma in the plasma generating space PS. Also, when plasma processing is performed on the semiconductor wafer W by using the radio frequency power supply 15 and the processing gas supply unit 26, the control unit 40 controls the plurality of electromagnets 50 by using the exciter 51 to generate a magnetic field in the chamber 2. That is, the control unit 40 functions as a magnetic field control unit. Accordingly, the control unit 40 may stably maintain discharge by facilitating radio frequency discharge firing (plasma ignition).

Also, the control unit 40 controls the drive unit 56 to transfer the semiconductor wafer W to the chamber 2. The control unit 40 is configured to obtain position information of the semiconductor wafer W (position of the pick unit 52b) based on control information (for example, the number of steps) of the drive unit 56. For example, the control unit 40 obtains in advance relationship data between the number of steps and the position of the pick unit 52b. The control unit 40 specifies the position of the pick unit 52b based on the control information and the relationship data. That is, the control unit 40 includes a position specifying unit for specifying the position of the pick unit 52b. Also, the control unit 40 may perform control by measuring the position of the pick unit 52b by using a sensor or the like which is separately disposed.

The control unit 40 controls the plurality of electromagnets 50 in such a manner that when the semiconductor wafer W is transferred to the plasma processing system 1, an force in upward direction applied to the transfer arm 52 increases as a length from the arm shaft 53 to the front end of the pick unit 52b increases. A control method of the control unit 40 will be explained below.

Figure 4:
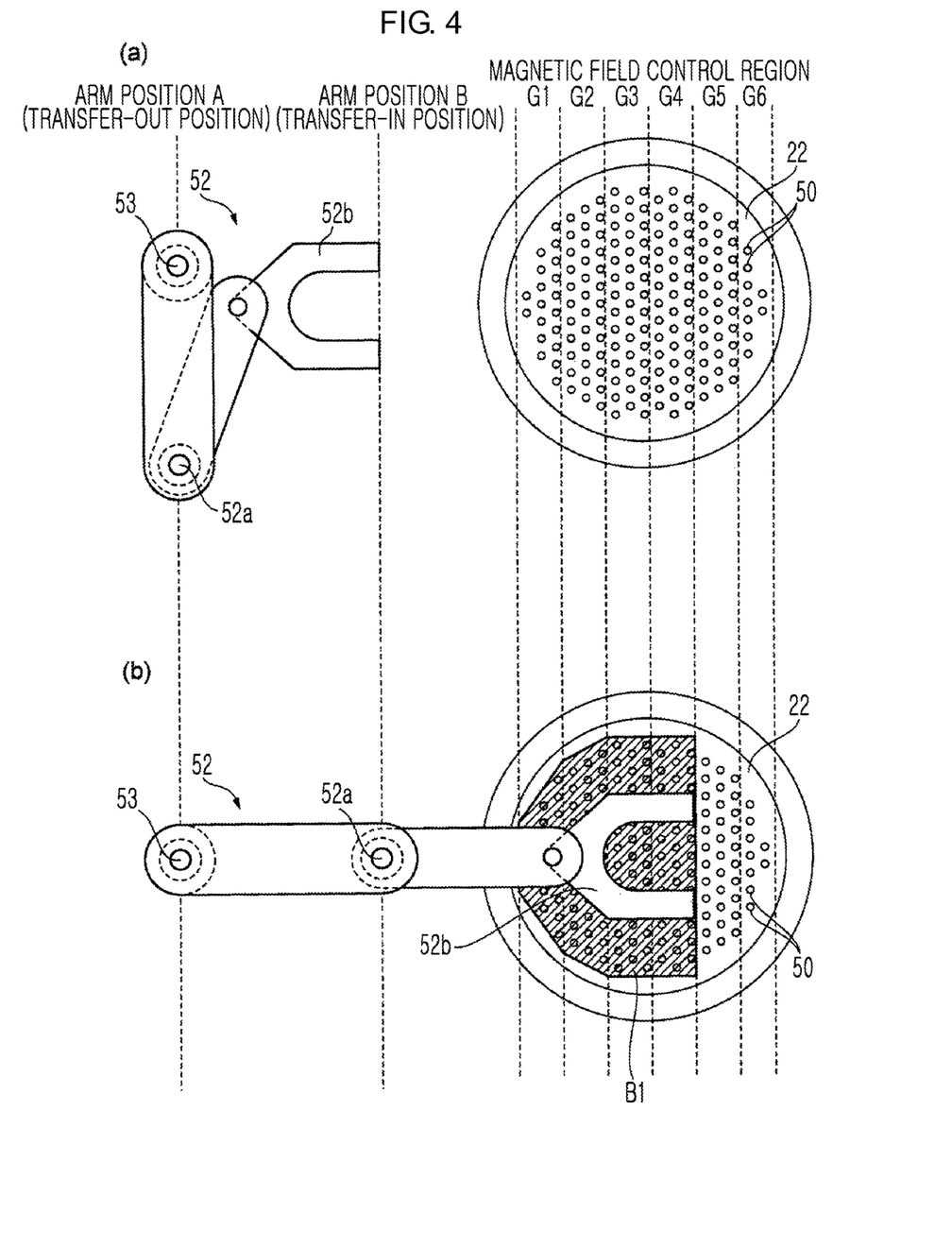
FIG. 4 is a set of views for explaining a relationship between an arm position and a magnetic field control region in a control method, wherein (a) of FIG. 4 shows that the transfer arm retracts and (b) of FIG. 4 shows that the transfer arm extends.

First, a first control method will be explained. FIG. 4 is view for explaining a relationship between an arm position and a magnetic field control region. In FIG. 4, positions of the transfer arm 52 and the pick unit 52b (arm positions) are on the left side and an object to be controlled (control area of magnetic field) of the electromagnets 50 disposed on the electrode plate 22 is on the right side. FIG. 4 is bottom view. (a) of FIG. 4 shows that the transfer arm 52 retracts. (b) of FIG. 4 shows that the transfer arm 52 extends. Also, for convenience of explanation, the transfer arm 52 is a multi-joint arm and an arm position is identified by using the bending portion 52a of the transfer arm 52. In FIG. 4, a case where the bending portion 52a is located to transfer the semiconductor wafer W out of the plasma processing system 1 is referred to as an arm position A, and a case where the bending portion 52a is located to transfer the semiconductor wafer W into the plasma processing system 1 is referred to as an arm position B.

Figure 5:
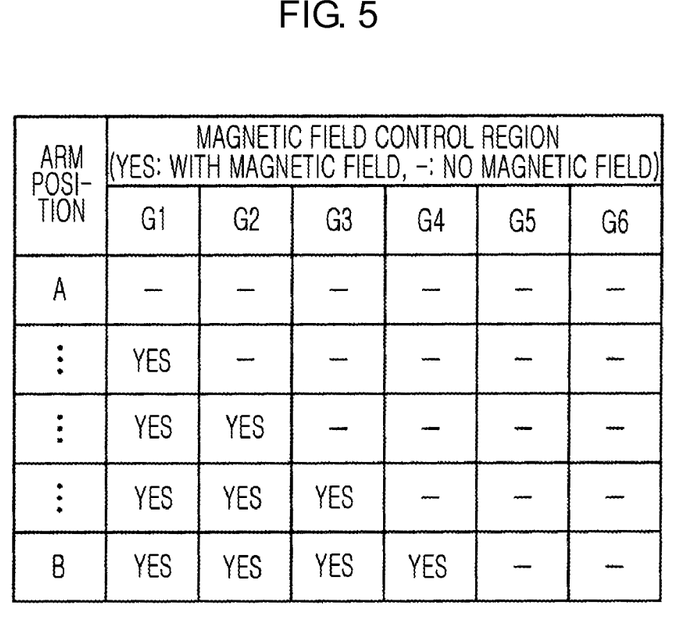
FIG. 5 is a table showing a relationship between an arm position and a magnetic field control region.

As shown in (a) of FIG. 4, the control unit 40 does not supply current to the electromagnets 50 when the transfer arm 52 is located at the arm position A (transfer-out position). However, as shown in (b) of FIG. 4, the control unit 40 controls the plurality of electromagnets 50 disposed to face the front end of the transfer arm 52 when the transfer arm 52 is located at the arm position B (transfer-in position). As shown in FIG. 4, the control unit 40 supplies current to the electromagnets 50 included in a region B1 that includes the groups G1 through G4, to generate a magnetic field. The control unit 40 supplies current to the electromagnets 50 in such a manner that as the transfer arm 52 extends, that is, the distance between the front end of the transfer arm 52 and the arm shaft (point) 53 increases, the magnetic field control region increases (the number of electromagnets 50 to be controlled increases). The first control method is shown in FIG. 5. In a table of FIG. 5, a row represents an arm position, and a column represents a magnetic field control region. Arm positions A through B are arm positions from when the transfer arm 52 retracts to when the transfer arm 52 extends. The magnetic field control region is expressed with the groups G1 through G6. In the table, 'yes' denotes a region to which current is supplied. As shown in FIG. 5, as the transfer arm 52 changes from the arm position A toward the arm position B, the control unit 40 gradually expands the magnetic field control region, that is, to the group G1, to the groups G1 and G2, to the groups G1, G2 and G3, and to the groups G1, G2, G3 and G4. As such, the control unit 40 controls the plurality of electromagnets 50 in such a manner that the force in upward direction applied to the transfer arm 52 increases as the length from the arm shaft 53 to the front end of the transfer arm 52 increases.

In the first control method, the control unit 40 obtains position information of the pick unit 52b from the control information of the transfer arm 52, and sets the magnetic field control region every time the position information is obtained, but the control unit 40 may control a magnetic field without using the position information of the pick unit 52b. For example, the control unit 40 may perform control such that current is supplied to all of the groups G1 through G4 irrespective of a position of the pick unit 52b when the semiconductor wafer W is transferred. Alternatively, the control unit 40 may change the amount of current between groups. For example, the control unit 40 previously specifies a transfer path of the transfer arm 52 and the electromagnets 50 disposed along the transfer path. The control unit 40 previously adjusts the amount of current supplied to the electromagnets 50 according to a position of the transfer arm 52 assumed to face the electromagnets 50. That is, the control unit 40 previously includes a map of the amount of current supplied to the plurality of electromagnets 50 and performs control such that current is supplied to the electromagnets 50 based on the map irrespective of a position of the pick unit 52b when the semiconductor wafer W is transferred. According to the map of the amount of current, for example, largest current is supplied to the electromagnets 50 (or groups) assumed to face the front end of the transfer arm 52 when the transfer arm 52 extends to its maximum, and smaller current is gradually applied to other electromagnets 50 disposed along the transfer path as the position of the transfer arm 52 assumed to face the electro magnets 50 is closer to an end.

Figure 6:
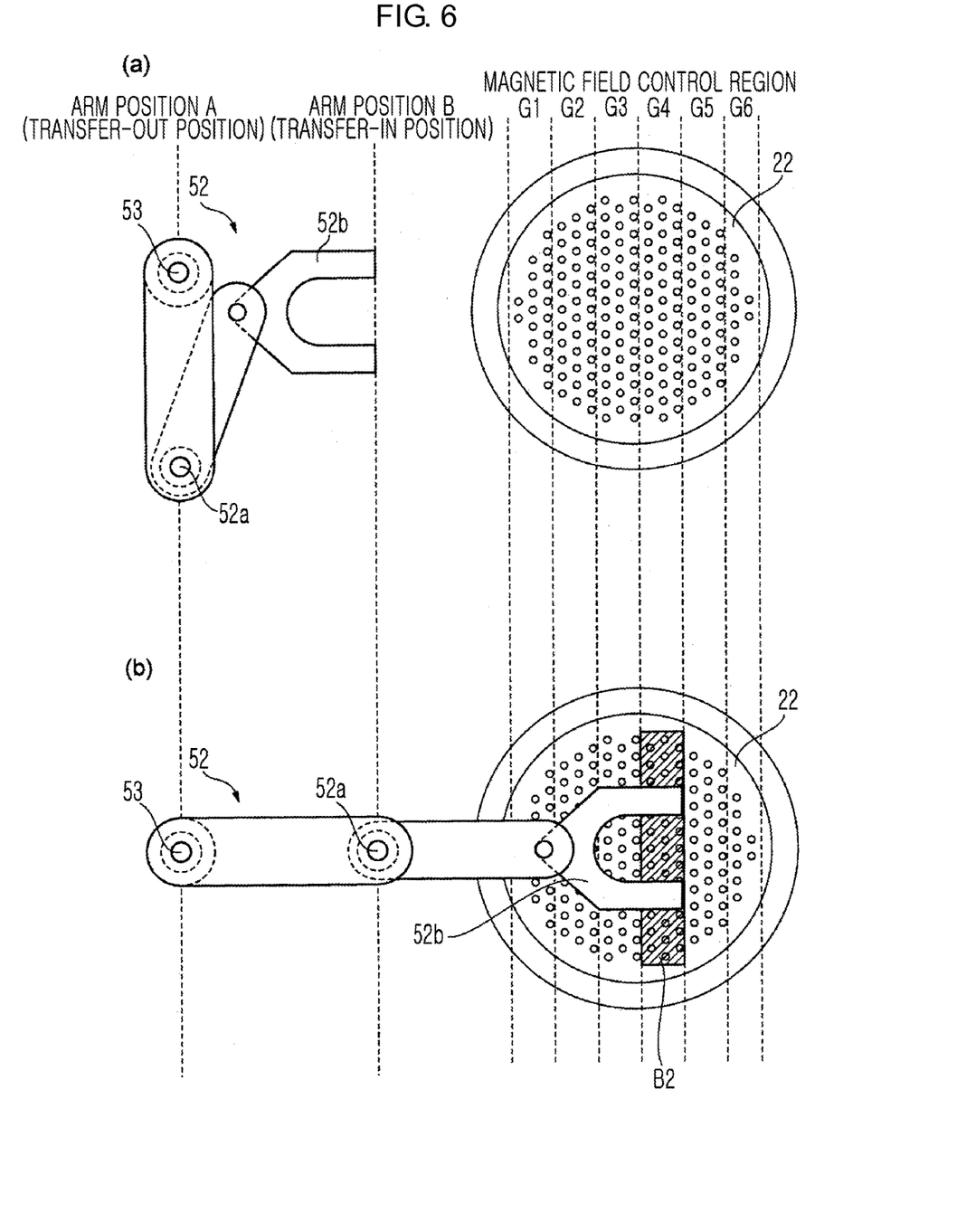
FIG. 6 is a set of views for explaining a relationship between an arm position and a magnetic field control region in another control method, wherein (a) of FIG. 6 shows that the transfer arm retracts and (b) of FIG. 6 shows that the transfer arm extends.

Next, a second control method will be explained. FIG. 6 is view for explaining a relationship between an arm position and a magnetic field control region. In FIG. 6, positions of the transfer arm 52 and the pick unit 52b (arm positions) are on the left side, and an object to be controlled (magnetic field control region) of the electromagnets 50 disposed on the electrode plate 22 is on the right side. FIG. 6 is bottom view. (a) of FIG. 6 shows that the transfer arm 52 retracts. (b) of FIG. 6 shows that the transfer arm 52 extends. Also, for convenience of explanation, the transfer arm 52 is a multi-joint arm and an arm position is identified by using the bending portion 52a of the transfer arm 52. In FIG. 6, a case where the bending portion 52a is located to transfer the semiconductor wafer W out of the plasma processing system 1 is referred to as an arm position A and a case where the bending portion 52a is located to transfer the semiconductor wafer W into the plasma processing system 1 is referred to as an arm position B.

Figure 7:
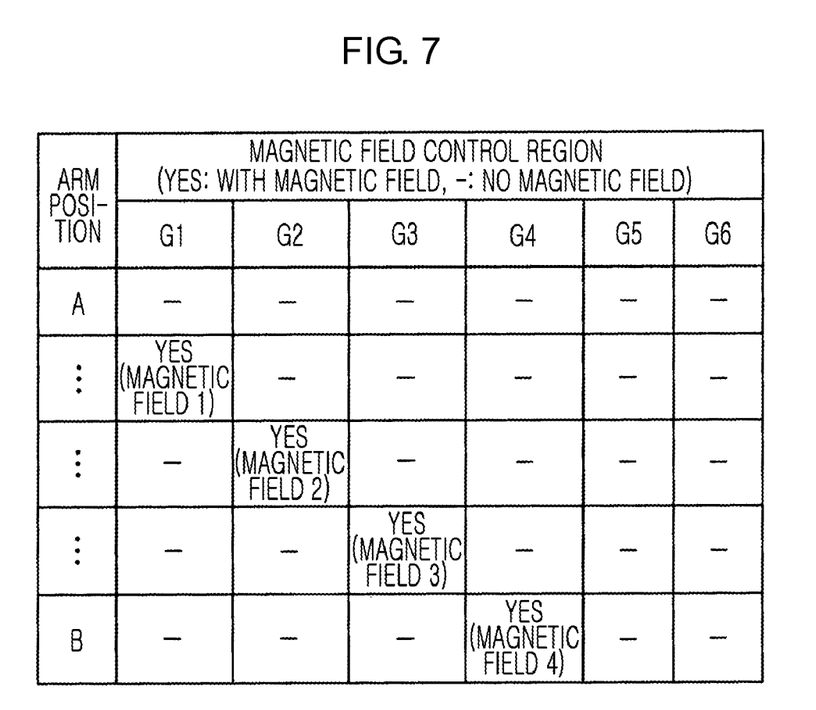
FIG. 7 is a table showing a relationship between an arm position and a magnetic field control region.

As shown in (a) of FIG. 6, the control unit 40 does not supply current to the electromagnets 50 when the transfer arm 52 is located at the arm position A (transfer-out position). However, as shown in (b) of FIG. 6, the control unit 40 controls only the plurality of electromagnets 50 disposed to face the front end of the transfer arm 52 when the transfer arm 40 is located at the arm position B (transfer-in position). As shown in FIG. 6, the control unit 40 supplies current to the electromagnets 50 included in a region B2 that includes only the group G4, to generate a magnetic field. The control unit 40 supplies current to the electromagnets 50 in such a manner that the magnetic field increases as the transfer arm 52 extends, that is, the distance between the front end of the transfer arm 52 and the arm shaft (point) 53 increases. The second control method is summarized in FIG. 7. In a table of FIG. 7, a row represents an arm position and a column represents a magnetic field control region. Arm positions A through B are arm positions from when the transfer arm 52 retracts to when the transfer arm extends. The magnetic field control region is expressed with the groups G1 through G6 of the electromagnets 50. In the table, 'yes' denotes a region to which current is supplied. Magnetic fields 1 through 4 denote magnetic fields having different strengths, and a magnetic field having a greater strength is indicated with a higher number. As shown in FIG. 7, the control unit 40 supplies current to only the electromagnets 50 disposed to face the front end of the transfer arm 52 and gradationally increases a strength of a magnetic field to be generated as the transfer arm 52 moves from the arm position A toward the arm position B. As such, the control unit 40 controls the plurality of electromagnets 50 in such a manner that the force in upward direction applied to the transfer arm 52 increases as the length from the arm shaft 53 to the front end of the transfer arm 52 increases.

As described above, in the transfer apparatus 80 and the plasma processing system 1 of the present embodiment, the control unit 40 controls the plurality of electromagnets 50 in such a manner that the force in upward direction applied to the transfer arm 52 increases as the length from the arm shaft 53 to the front end of the transfer arm 52 increases. That is, a magnetic field in the chamber 2 is controlled according to the length from the arm shaft 53 to the front end of the transfer arm 52, and the force in upward direction is applied to the transfer arm 52. Due to the force in upward direction applied by the magnetic field, even when the transfer arm 52 extends, a downward inclination of the front end of the transfer arm 52 may be reduced.

Figure 9A:
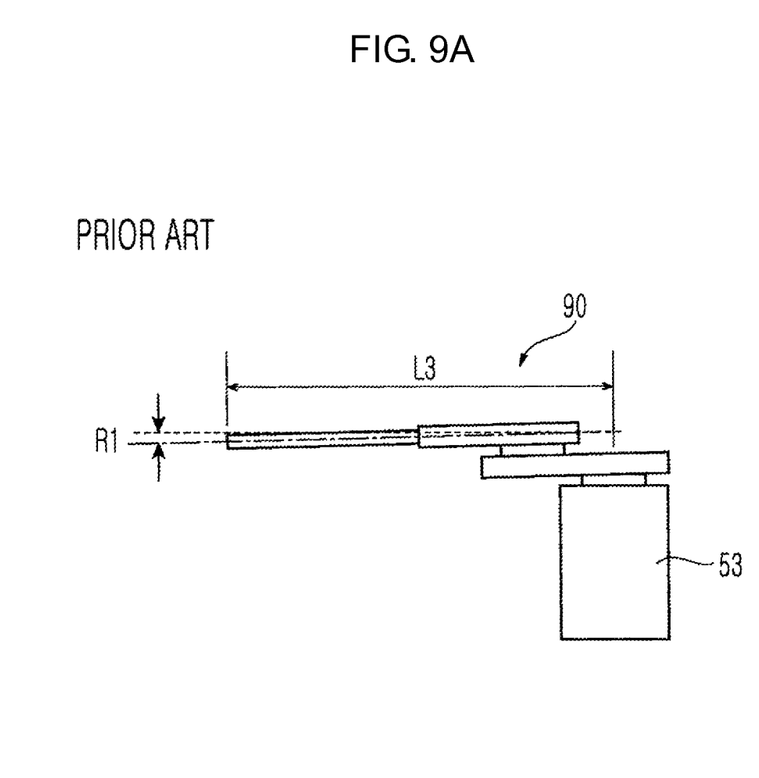
Figure 9B:
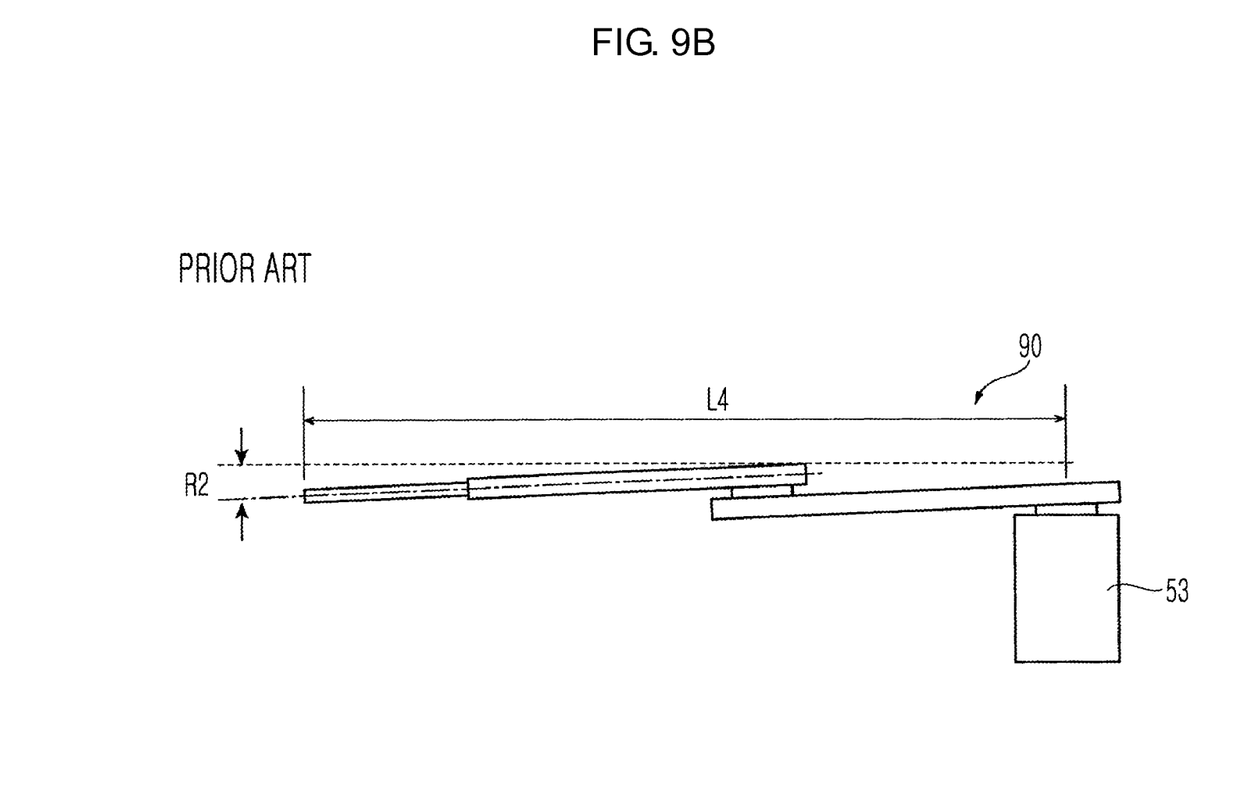

In order to explain an operation and effect of the transfer apparatus 80, a conventional transfer apparatus will be explained. FIGS. 9A and 9B are schematic views for explaining a conventional transfer apparatus. FIG. 9A shows that a transfer arm 90 retracts. In FIG. 9A, a length from the arm shaft 53 to a front end of the transfer arm 90 is L3, and a horizontal inclination (amount of warp) is R1. FIG. 9B shows that the transfer arm 90 extends. In FIG. 9B, a length from the arm shaft 53 to the front end of the transfer arm 90 is L4, and a horizontal inclination (amount of warp) is R2. The length L4 is greater than the length L3. As shown in FIGS. 9A and 9B, as the length from the arm shaft 53 to the front end of the transfer arm 90 increases, the risk that the front end of the transfer arm 90 is downwardly inclined due to its weight may increase.

Figure 8A:
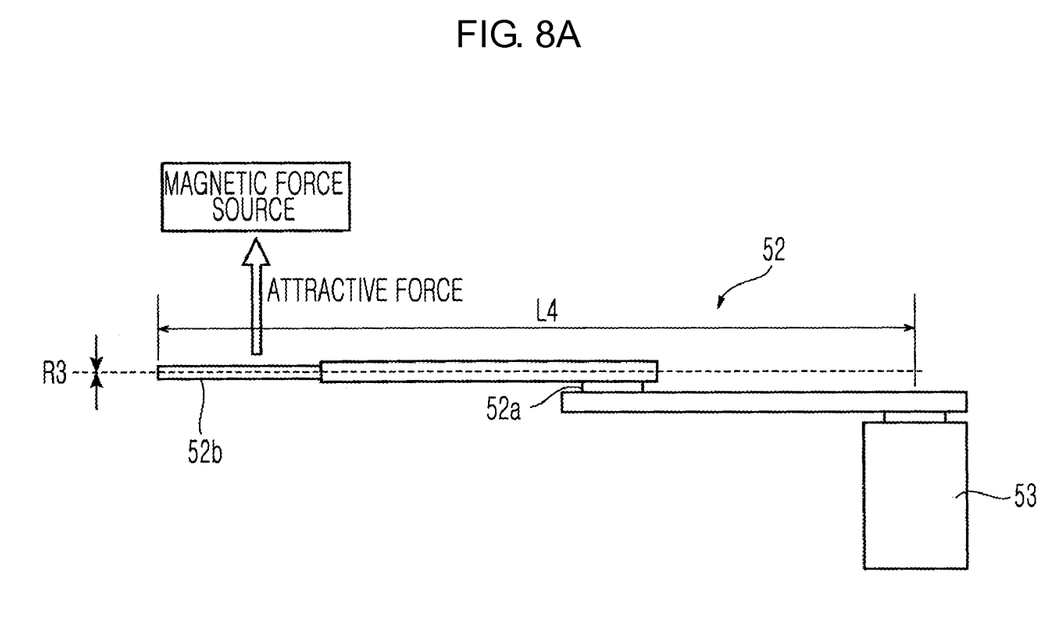
Figure 8B:
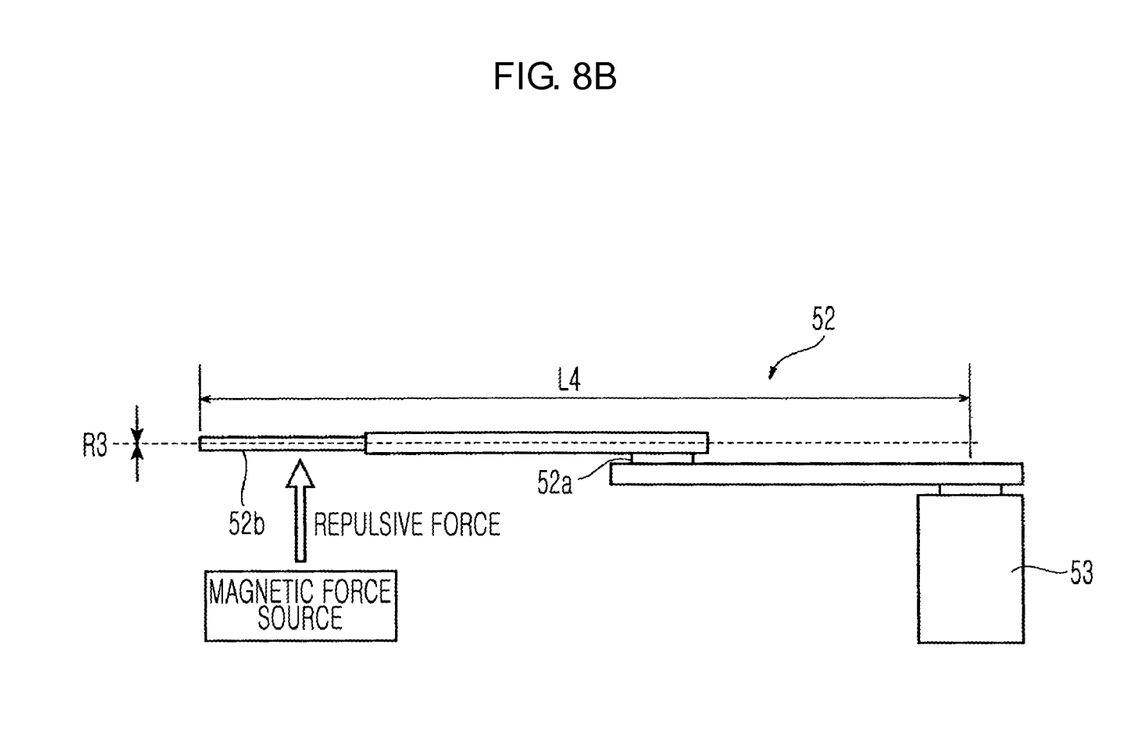

However, according to the transfer apparatus 80 of the present embodiment, the force in upward direction may be applied to the transfer arm 52 due to an attractive force of the electromagnets 50. FIG. 8A schematically shows that an attractive force is applied to the transfer arm 53 due to a magnetic force source. The length from the arm shaft 53 to the front end of the transfer arm 52 is equal to the length L4 of FIG. 9B. As shown in FIG. 8A, an attractive force is generated between the magnetic force source and the transfer arm 52. That is, an force in upward direction is applied to the transfer arm 52. Accordingly, a horizontal inclination (amount of warp) R3 may be reduced. As such, even when the transfer arm 52 extends, a downward inclination of the front end of the transfer arm 52 may be reduced. Also, by reducing the downward inclination of the front end of the transfer arm 52, interference with adjacent parts may be avoided and a precision at which the semiconductor wafer W is transferred may be prevented from being reduced.

According to the transfer apparatus 80 of the present embodiment, since the plurality of electromagnets 50 are arranged in a lattice shape to face the transfer arm 52, a magnetic field may be finely controlled.

According to the transfer apparatus 80 of the present embodiment, since the number of electromagnets 50 to which current is to be supplied is increased according to a position of the pick unit 52b by the control unit 40, a magnetic field in the chamber 2 may increase as a length from the arm shaft 53 to a front end of the transfer arm 52 increases. Accordingly, the plurality of electromagnets 50 may be controlled to increase an force in upward direction applied to the transfer arm 52.

According to the transfer apparatus 80 of the present embodiment, since the amount of current supplied to the plurality of electromagnets 50 is increased by the control unit 40 according to the position of the pick unit 52b, a magnetic field in the chamber 2 may increase as the length from the arm shaft 53 to the front end of the transfer arm 52 increases. Accordingly, the plurality of electromagnets 50 may be controlled to increase the force in upward direction applied to the transfer arm 52.

According to the transfer apparatus 80 of the present embodiment, since the plurality of electromagnets 50 disposed to face the position of the pick unit 52b are each considered as an object to be controlled by the control unit 40, current is supplied to only the electromagnets 50 close to the front end of the transfer arm 52 and the supplied current amount is increased according to the position of the pick unit 52b. Accordingly, the plurality of electromagnets 50 may be efficiently controlled to increase the force in upward direction applied to the transfer arm 52.

According to the plasma processing system 1 of the present embodiment, a magnetic field for applying the force in upward direction to the transfer arm 52 and a magnetic field for stably maintaining plasma may be generated with the same electromagnets 50.

The present invention is not limited to the embodiments mentioned above. For example, although the radio frequency power supply 15 is connected to the holding stage 3 in the above embodiments, the radio frequency power supply 15 may be connected to the shower head 20. That is, the radio frequency power supply 15 may supply a radio frequency voltage to at least one of the holding stage 3 and the shower head 20.

Although the semiconductor wafer W is transferred to the chamber 2 which is a processing container in the above embodiments, an transfer location to which the semiconductor wafer W is transferred is not limited to the processing container, and the semiconductor wafer W may be transferred from a transfer chamber to a transfer chamber (case).

Although the plurality of electromagnets 50 are disposed over the transfer arm 52 in the above embodiments, the plurality of electromagnets 50 may be disposed under the transfer arm 52. In this case, the transfer arm 52 may be formed of a magnetic body and may be magnetized, or a magnetized magnetic body may be attached to at least a portion of the transfer arm 52. The force in upward direction is applied to the transfer arm 52 due to a repulsive force with the magnetic body. In such a structure, the force in upward direction may be applied to the transfer arm 52 due to a repulsive force generated between the plurality of electromagnets 50 and the transfer arm 52. Also, the plurality of electromagnets 50 may be disposed over and under the transfer arm 52, and a downward inclination of the front end of the transfer arm 52 may be reduced by using both an attractive force and a repulsive force.

Also, although the plurality of electromagnets 50 are disposed in the chamber 2 in the above embodiments, the plurality of electromagnets 50 may be disposed on the transfer arm 52.

As described above, according to the various aspects or embodiments of the present invention, a transfer apparatus and a plasma processing system which may reduce a downward inclination of a front end of a transfer arm generated by a warp are provided.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A transfer apparatus for transferring an object to be transferred into a case, the transfer apparatus comprising:

a transfer arm which has a pick unit on a front end portion thereof and extends and retracts in a horizontal direction, wherein the object is capable of being held on the pick unit, and at least a portion of the transfer arm is formed of a magnetic material;

an arm shaft which is positioned outside the case and supports a base end portion of the transfer arm;

a plurality of electromagnets which are disposed over the transfer arm so as to vertically face a top surface of the pick unit of the transfer arm when the transfer arm is extended, or disposed under the transfer arm so as to vertically face a bottom surface of the pick unit of the transfer arm when the transfer arm is extended, wherein a region in which the plurality of electromagnets are disposed is divided into a plurality of imaginary sub-regions; and a magnetic field control unit which is configured to control the strength of a magnetic field of the electromagnets (i) by turning on or turning off the electromagnets in each of the sub-regions or (ii) by changing an amount of current between the sub-regions such that, when the pick unit vertically faces the plurality of electromagnets by the horizontal extending of the transfer arm, (i) the number of sub-regions in which the electromagnets are turned on is increased so that the sub-region closest to the arm shaft through the sub-region which vertically faces the pick unit are turned on, or (ii) among the plurality of sub-regions, a largest current is supplied to the sub-region which vertically faces the pick unit, and thus a magnetic force between the electromagnets facing the pick unit of the transfer arm and the magnetic material of the transfer arm increases, thereby increasing a force in upward direction applied to the pick unit of the transfer arm and reducing a downward inclination of the pick unit of the transfer arm.

2. The transfer apparatus of claim 1, wherein the plurality of electromagnets are disposed over the transfer arm and apply the force in upward direction to the transfer arm due to an attractive force with the magnetic material.

3. The transfer apparatus of claim 1, wherein a magnetized magnetic material is attached to at least a portion of the transfer arm, the plurality of electromagnets are disposed under the transfer arm and apply the force in upward direction to the transfer arm due to a repulsive force with the magnetic material.

4. The transfer apparatus of claim 1, wherein the electromagnets are arranged in a lattice shape to face the transfer arm.

5. The transfer apparatus of claim 4, wherein the magnetic field control unit is configured such that, as the transfer arm extends in the horizontal direction, the number of electromagnets to which current is supplied is increased.

6. The transfer apparatus of claim 4, wherein the magnetic field control unit is configured to increase the amount of current supplied to the electromagnets as the transfer arm extends in the horizontal direction.

7. The transfer apparatus of claim 6, wherein the magnetic field control unit controls the electromagnets disposed to face the position of the pick unit.

8. A plasma processing system comprising a plasma processing device that performs plasma processing on a substrate and a transfer apparatus that transfers the substrate to the plasma processing device, the plasma processing device including:

a processing container which defines a processing space;

a lower electrode which has a top surface capable of holding the substrate and is disposed in a lower portion of the processing space;

an upper electrode which is disposed in an upper portion of the processing space to face the lower electrode;

a radio frequency power supply unit which supplies a radio frequency voltage to at least one of the lower electrode and the upper electrode;

a processing gas supply unit which supplies a processing gas into the processing space; and a plurality of electromagnets, and the transfer apparatus including:

a transfer arm which has a pick unit on a front end portion thereof and extends or retracts in a horizontal direction, wherein the substrate is capable of being held on the pick unit, and at least a portion of the transfer arm is formed of a magnetic material; and an arm shaft which is positioned outside the processing container and supports a base end portion of the transfer arm, wherein a plurality of electromagnets are disposed at the upper electrode in the processing container so as to vertically face a top surface of the pick unit of the transfer arm when the transfer arm is extended, or disposed at the lower electrode in the processing container so as to vertically face a bottom surface of the pick unit of the transfer arm when the transfer arm is extended, a region in which the plurality of electromagnets are disposed is divided into a plurality of imaginary sub-regions, the plasma processing system further comprises a magnetic field control unit, the magnetic field control unit is configured to control the strength of a magnetic field of the electromagnets (i) by turning on or turning off the electromagnets in each of the sub-regions or (ii) by changing an amount of current between the sub-regions such that, when the pick unit is located under the upper electrode or over the lower electrode to vertically face the plurality of electromagnets by the horizontal extending of the transfer arm, (i) the number of sub-regions in which the electromagnets are turned on is increased so that the sub-region closest to the arm shaft through the sub-region which vertically faces the pick unit are turned on, or (ii) among the plurality of sub-regions, a largest current is supplied to the sub-region which vertically faces the pick unit, and thus a magnetic force between the electromagnets facing the pick unit of the transfer arm and the magnetic material of the transfer arm increases, thereby increasing a force in upward direction applied to the pick unit of the transfer arm and reducing a downward inclination of the pick unit of the transfer arm, and the magnetic field control unit is further configured to control the electromagnets such that a magnetic field is generated in the processing container when plasma processing is performed on the substrate by using the radio frequency power supply unit and the processing gas supply unit.

9. The plasma processing system of claim 8, wherein the electromagnets are disposed on the upper electrode and apply the force in upward direction to the transfer arm due to an attractive force with the magnetic material.

* * * * *